United States Patent [19]
Chiu et al.

[11] Patent Number: 5,462,888
[45] Date of Patent: Oct. 31, 1995

[54] PROCESS FOR MANUFACTURING SEMICONDUCTOR BICMOS DEVICE

[75] Inventors: Tzu-Yin Chiu, Martinsville, N.J.; Frank M. Erceg, Bethlehem; Francis A. Krafty, both of Bangor, Pa.; Te-Yin M. Liu, Hsin-Chu, Taiwan; William A. Possanza, Northampton, Pa.; Janmye Sung, Warren, N.J.

[73] Assignee: AT&T IPM Corp., Coral Gables, Fla.

[21] Appl. No.: 254,223

[22] Filed: Jun. 6, 1994

[51] Int. Cl.⁶ .................................................. H01L 21/70
[52] U.S. Cl. .............................. 437/57; 437/31; 437/34; 437/50; 437/58; 437/59; 437/162; 437/186; 437/984; 257/269; 257/270; 148/DIG. 106; 148/DIG. 123; 148/DIG. 151
[58] Field of Search ..................... 437/57, 59, 34, 437/162, 50, 58, 984, 186, 31; 257/269, 370; 148/DIG. 106, DIG. 123, DIG. 151

[56] References Cited

U.S. PATENT DOCUMENTS

| | | | |
|---|---|---|---|
| 4,784,971 | 11/1988 | Chiu et al. | 437/57 |
| 4,824,796 | 4/1989 | Chiu et al. | 437/57 |
| 4,876,217 | 10/1989 | Zdebel | 437/67 |

Primary Examiner—Olik Chaudhuri
Assistant Examiner—Long Pham
Attorney, Agent, or Firm—Richard J. Botos

[57] ABSTRACT

A process for fabricating transistors on a substrate is disclosed. In accordance with the process, stacks of material are formed on the surface of the substrate. Walls of silicon dioxide are created around the stacks in order to insulate the material within the stacks from the material deposited outside of the walls. A first layer of polycrystalline material is deposited over the substrate and selectively removed such that only those portions of the polycrystalline layer that surround the stacks of material remain. A layer of silicon nitride or silicon dioxide is then formed over the substrate surface. A first resist is then spun on the substrate surface. This resist aggregates near the stacks of material. An isolation mask is generated that leaves exposed only those areas of the substrate that correspond to the area of overlap between the first polycrystalline area and the stacks of material, which also contain a layer of polycrystalline material. The substrate is then subjected to an etchback process to remove the portion of the polysilicon material that overlaps the material in the stacks.

7 Claims, 6 Drawing Sheets

PROCESS FOR MANUFACTURING SEMICONDUCTOR BICMOS DEVICE

TECHNICAL FIELD

The invention relates to semiconductor processing and more particularly to a semiconductor process that produces a device layer with a high density of discrete devices or a layout with a mixed high and low density of discrete devices on a single chip.

BACKGROUND OF THE INVENTION

Processes for fabricating a combination of bipolar and field effect transistors (FET) on the same semiconductor chip are disclosed in U.S. Pat. No. 4,824,796 to Chiu et al. and U.S. Pat. No. 4,784,971 to Chiu et al. In processes, stacks of appropriate material formed on a semiconductor substrate, e.g., a silicon wafer, over those areas of the substrate which will eventually correspond to the gate electrodes of the MOS devices and the emitter electrode of the bipolar devices. These stacks (such as 51, 52, and 53 in FIG. 1) include a layer of doped polycrystalline material 41, and an etch stop layer 42 such as silicon dioxide or silicon nitride. These stacks also include a second layer of polysilicon material 43. Stacks 51, 52, and 53 are formed by depositing layers of material 41, 42, and 43 and then selectively removing portions of those layers to form the stacks.

A conformal oxide 61 is then formed over the entire wafer to a thickness of about 200 nm as indicated in FIG. 2. An anisotropic reactive ion etching process is then used to remove potions of the oxide. This reactive ion etching removes the oxide that was deposited over the tops of the stocks 51, 52, and 53 and the oxide on the substrate surface between the walls 71 of oxide adjacent to the stacks, which result in silicon dioxide walls 71 surrounding the stacks 51, 52, and 53 as depicted in FIG. 3.

The substrate is then cleaned and a polycrystalline silicon (polysilicon) layer 81 having a thickness of about 200 nm is deposited over the entire wafer as shown in FIG. 4. A photolithography process is used to remove the portions of the polycrystalline layer 81 that is deposited between stacks 51, 52, and 53. The portions of the polysilicon material 81 that are removed by this step 82 are set off by dashes in FIG. 4. The polysilicon material is etched isotropically so that the individual devices formed from stacks 51, 52, and 53 are electrically isolated.

Dopant is introduced into the polysilicon layer by first masking those areas of the device that are not desired to be doped with a photoresist (not shown) and then introducing dopant into the unmasked regions (not shown). The photoresist is then stripped from the device. This procedure is performed once to introduce p-type dopant into certain portions of the polysilicon martial 81 and once to introduce n-type dopant into certain other portions of the polysilicon material.

The entire substrate is then covered with a silicon nitride deposition layer 102 having a thickness of about 80 nm. This layer of silicon nitride is designated as 102 in FIG. 5A. The silicon nitride layer 102 conforms to the polysilicon layer 81, and protects the polysilicon 81 in a subsequent step during which a photoresist layer is selectively etched back.

A planar photoresist layer 101, as depicted in FIG. 5A, with a uniform thickness of 3 to 5 microns is formed over the entire substrate 10. This photoresist layer 101 is then etched back to a point where the portion of the silicon nitride layer 102 on the top of the stacks 51, 52 and 53 is clearly exposed. The exposed portion of the nitride layer 102 is then removed. After the exposed nitride layer 102 is removed, the remaining photoresist layer 101 is hardened and the polysilicon 81 above the stacks is selectively removed. The remaining photoresist material 101 is then removed. The resulting structure is depicted in FIG. 5B.

In the above process, it is important that only those portions of the nitride layer 102 and the polysilicon layer 81 directly above the stacks be removed. Therefore, it is important that the photoresist be of uniform thickness over the stacks. Also, it is advantageous if the resist material is much thicker over the areas of the substrate between the stacks, so that the surface of the substrate in these areas is not etched when the silicon nitride and polysilicon material from the tops of the stacks is being removed. As illustrated in FIG. 6, it is difficult to form a layer of uniform thickness over a surface on which the stacks are not spaced evenly. As illustrated in FIG. 6, the resist is one thickness 107 over the tops of the group of stacks 51, 52, and 53. However, the resist is another thickness, 108, over remote stack 54. Thickness 108 is therefore much less than thickness 107. This thickness differential leads to nonuniform processing as between the clustered stacks, 51, 52, and 53 and the remote stack 54. Furthermore, the thickness of the resist 101 between remote stack 54 and clustered stack 51 is much less than the thickness of the resist 101 between clustered stacks 51 and 52. Such nonuniformity is not desirable because it leads to overetch of some material stacks, the oxide and polysilicon materials surrounding these stacks, or the materials between the stacks. As a result, the performance of the discrete devices formed from these stacks may be degraded. Under these conditions, some improvement in the planarization process is desired.

SUMMARY OF THE INVENTION

The present invention contemplates a resist-etchback process for semiconductor device fabrication. In the process, a uniform layer of resist is formed over a substrate, e.g., a silicon wafer, with stacks of appropriate materials thereon.

The resist-etchback scheme selectively removes certain portions of a first doped polysilicon material layer that is formed over the substrate. The stacks of material on the substrate typically correspond to circuit elements such as, e.g., gate elements of the field effect transistors and the emitter elements of the bipolar transistors. The stacks of material typically contain a second doped polysilicon material layer.

A layer of silicon nitride or silicon dioxide is formed over the surface of the substrate. A resist material is then formed on the substrate surface. An example of a suitable resist is planarizing coating PC2-600 from Futurrex, Inc. of Newton, N.J. The resist material contains an organic polymer combined with an organic solvent.

It is advantageous if the polymer is not sensitive to radiant energy, i.e. light. That is, the polymer is not cured when exposed to radiant energy. It is advantageous if an organic solvent is combined with the polymer to provide a material with the desired viscosity. About 20 to about 40 weight percent of the resist is combined with about 60 to about 80 weight percent of an organic solvent such as n-butanol or 1-methoxy-2-propanol to provide a resist material with a suitable viscosity. Since the resist material is formed on the substrate surface using conventional techniques such as spinning, it is advantageous if the resist material flows when placed on the substrate surface and subjected to these techniques. In this regard, resist materials with viscosities of about 20 centipoise to about 2000 centipoise are regarded as suitable. After the resist material is formed on the substrate surface, it is hardened by baking.

An isolation mask is then generated over the wafer. The mask is generated by first depositing a layer of energy-sensitive material over the entire wafer surface. An image of a pattern that corresponds to the areas of the wafer surface that overlie an area of overlap between the first polysilicon material and the second polysilicon material is introduced into the energy-sensitive material using standard lithographic techniques. The pattern is developed and, as a result, the areas of overlap between the first polysilicon material and the second polysilicon material are exposed. The other areas of the substrate surface remain covered by the mask. It is advantageous if, after the overlapping areas of polysilicon material are determined, each individual area is expanded by a certain distance in both the x and y directions in the plane of the overlapping areas. It is advantageous if this expanded distance is at least half of the distance between two of the stacks on the wafer surface. A pattern that corresponds to these expanded areas is then formed in the resist material as described above. Consequently, portions of the substrate surface between stacks that are this distance apart or less will not be covered by the isolation mask. It is also advantageous if this expanded distance is less than about 1.5 microns, so that the portions of the substrate surface between stacks that are twice this distance apart or less are not covered by the isolation mask.

The isolation mask is made of a typical radiation-sensitive resist material. An example of a suitable resist material is Shipley 513, which is obtained commercially from the Shipley Co., located in Newton Mass. The mask is formed on the wafer surface using conventional techniques. One skilled in the art will appreciate that the particular radiation-sensitive resist material used depends upon factors such as the lithographic tools used, design rules, etc.

After the mask is deposited over the wafer, the wafer is subjected to etching conditions to remove both the resist material and the silicon nitride that overlies the overlapping polysilicon areas, thereby exposing the portion of the first polysilicon layer that overlies the second polysilicon layer. The remaining portions of the mask are then hardened and the exposed polysilicon material is etched back. A significant portion of the first polysilicon layer underlying the isolation mask is not removed during this etchback. The portions of the isolation mask and the resist material that remain on the substrate are then removed, leaving polysilicon/silicon dioxide walls around the remaining portion of the stacks which form insulating boundaries between the material within the stacks and the polysilicon material outside the walls.

The wafer is then heated so as to drive the dopants from the polysilicon material into the substrate in those areas where the doped polysilicon material is in contact with the substrate. A low resistance material is then selectively deposited over the polysilicon material so as to establish contact with the elements of the individual transistors.

BRIEF DESCRIPTION OF THE DRAWINGS

FIGS. 1 through 5A and 5B are sectional views of a semiconductor wafer in a process for fabricating a bipolar complementary metal oxide semiconductor (BICMOS) structure.

DETAILED DESCRIPTION

Figure 5A:
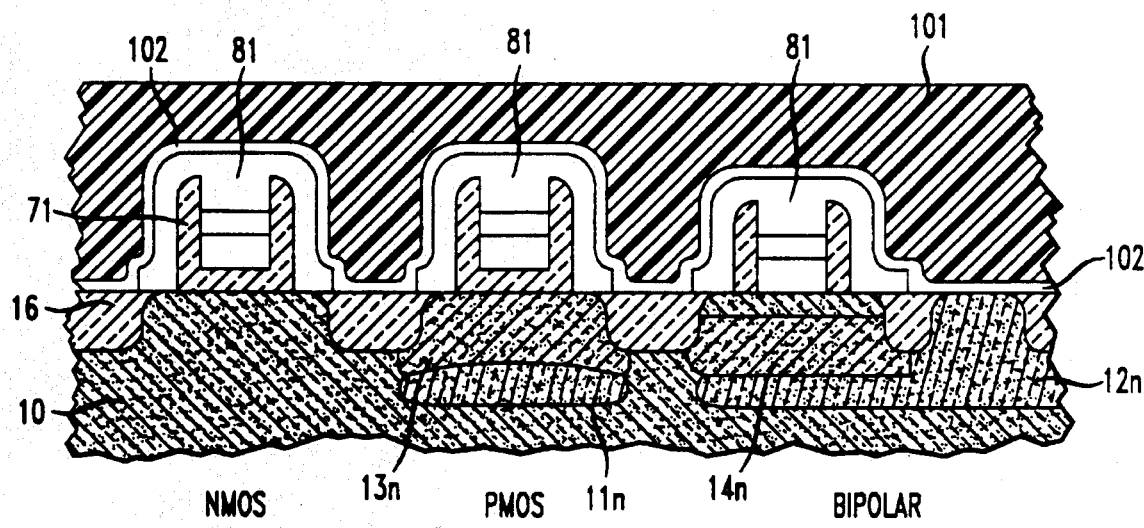
Figure 5B:
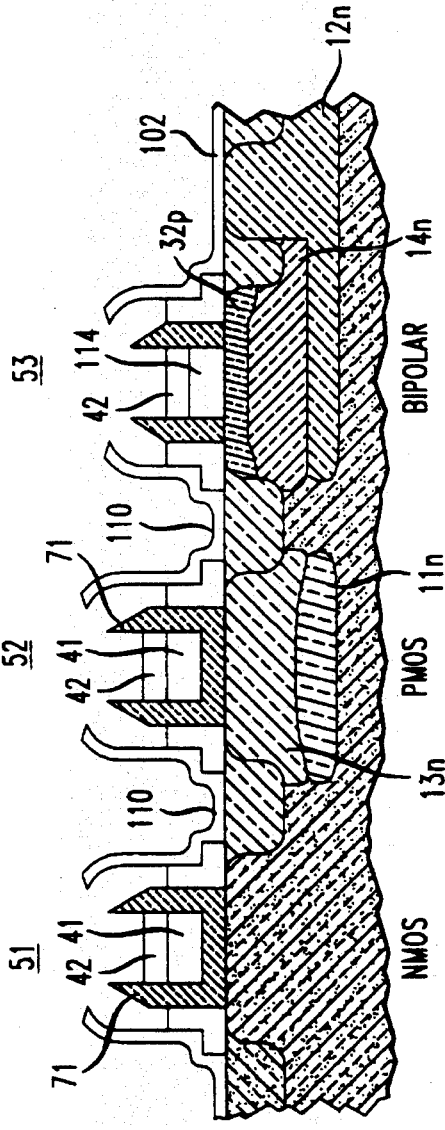
Figure 6:
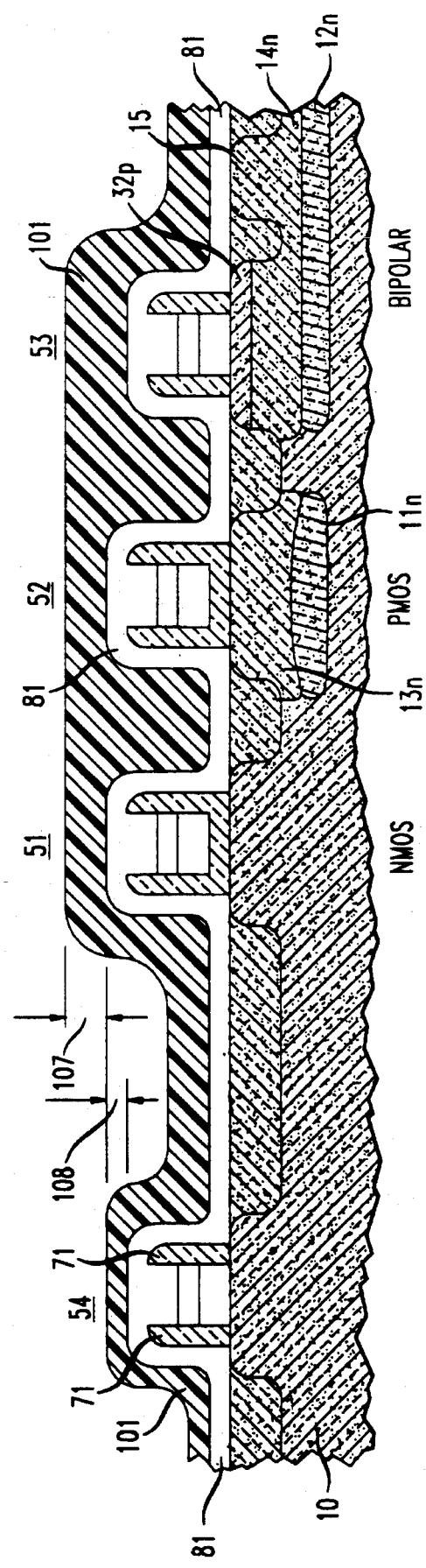
FIG. 6 is a sectional view of a semiconductor wafer with a mixed density of discrete devices formed thereon over which is applied a layer of photoresist.

Techniques well-known to those in the semiconductor processing art are used to create a semiconductor device as described in U.S. Pat. No. 4,824,796 to Chiu et al. and U.S. Pat. No. 4,784,971 to Chiu et al. The disclosures of both of these patents are incorporated by reference herein. In such processes, discrete devices are formed on a substrate, typically a silicon wafer, by a sequence of processing steps. In a sequence of processing steps stacks of materials 51, 52, and 53 are formed on a wafer 10 in which field isolation regions 16 and doped regions (11, 12, 13, and 14) are already formed (See FIG. 5A). The stacks of material typically contain a layer of doped polysilicon material 41, typically polysilicon a layer of silicon nitride 42, and a dummy layer of undoped polysilicon 43.

Figure 1:
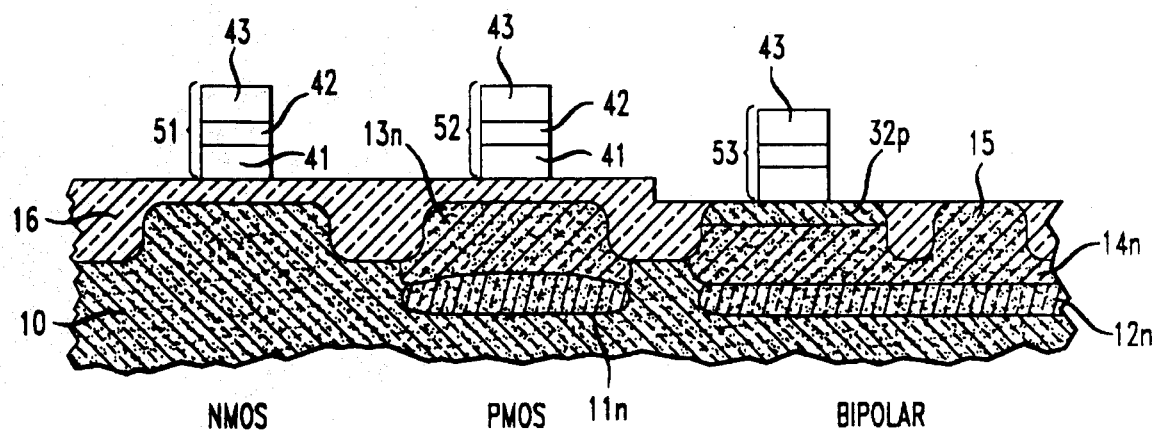
Figure 2:
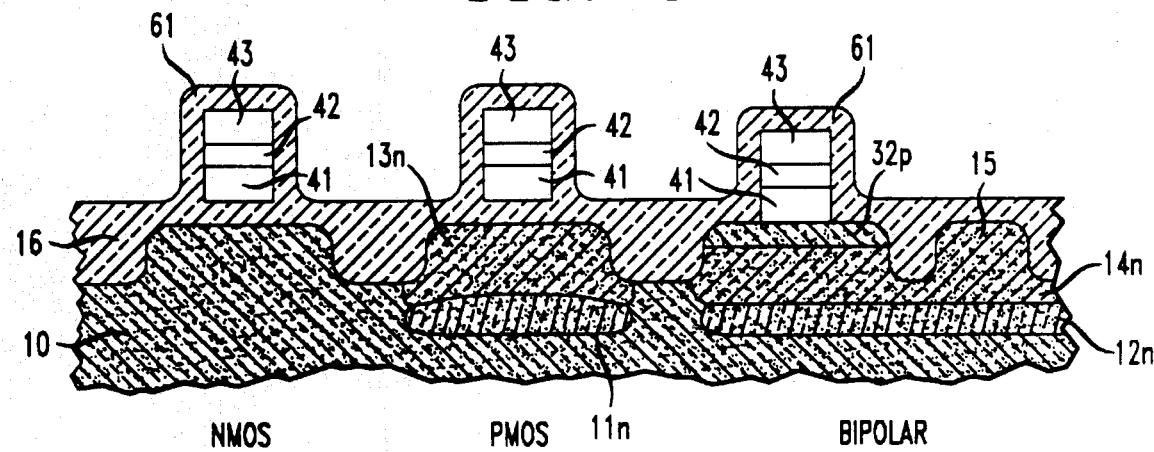
Figure 3:
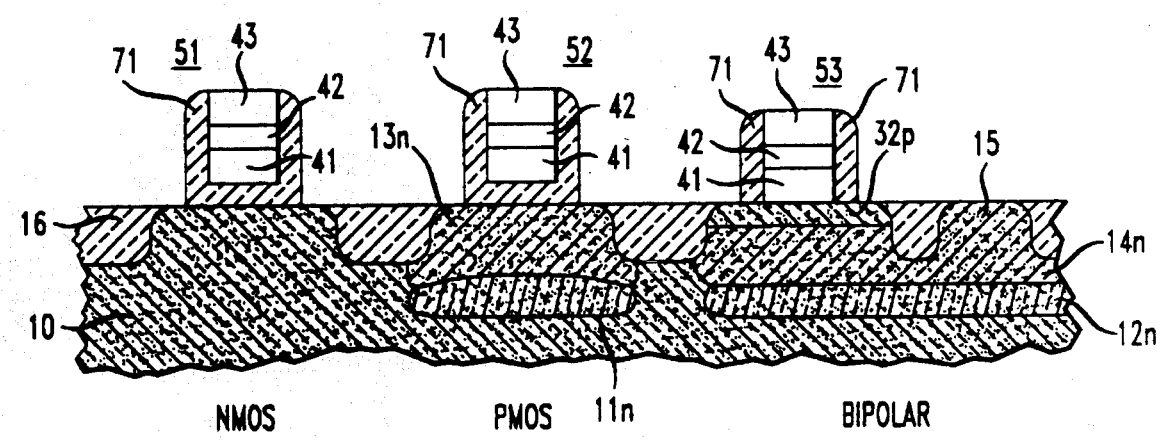
Figure 4:
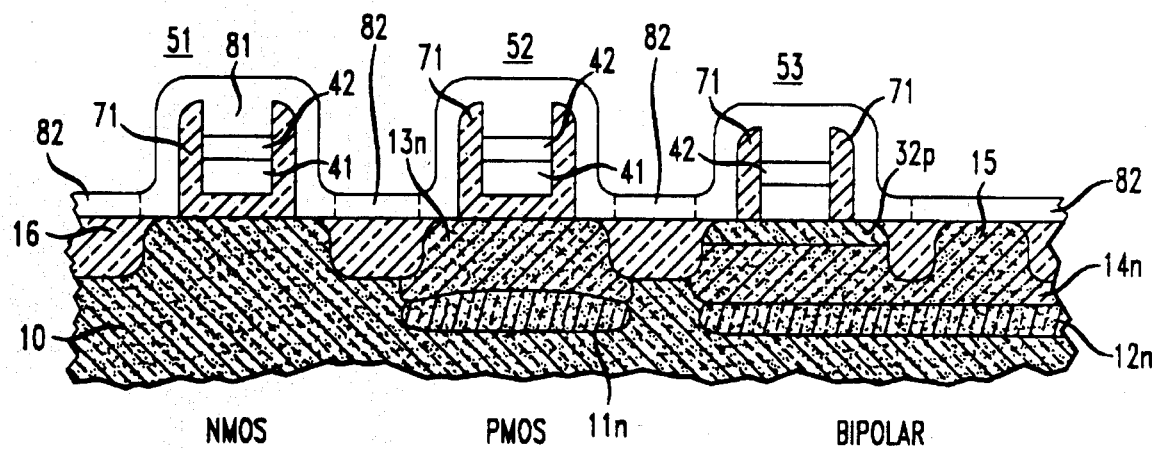

As depicted in FIGS. 2 and 3, a layer of silicon dioxide 61 is formed over the stacks of material and etched so that the tops of the stacks 51, 52, and 53 are exposed. This silicon dioxide layer 61 is isotropically etched to form silicon dioxide walls 71 on stacks 51, 52, and 53. As shown in FIG. 4, a layer of polycrystalline material 81, again typically polysilicon, is deposited over the stacks. The polysilicon layers 81 and 41 are used as a vehicle for the selective introduction of dopant into the substrate. For convenience, the polysilicon layer 81 is referred to as the first layer of polysilicon and the polysilicon material in the stacks 41 is referred to as the second layer of polysilicon.

After the device regions are formed on the substrate, the wafer is subjected to conditions which drive the dopant from the polysilicon material into the desired areas of the wafer. In order for the processing objectives to be obtained, the stacks of material must remain isolated by the silicon dioxide 71 throughout subsequent processing. Also, the doped polysilicon material 81 and 41 must remain over those regions of the wafer in which dopant is to be driven from the polysilicon into the wafer. Those portions of the polysilicon material that are used as a dopant source for the underlying substrate in subsequent processing are referred as critical polysilicon. To achieve these objectives, a resist-etchback scheme is used to remove the unwanted polysilicon from the wafer while retaining the critical polysilicon and other desired materials on the wafer surface.

Figure 7:
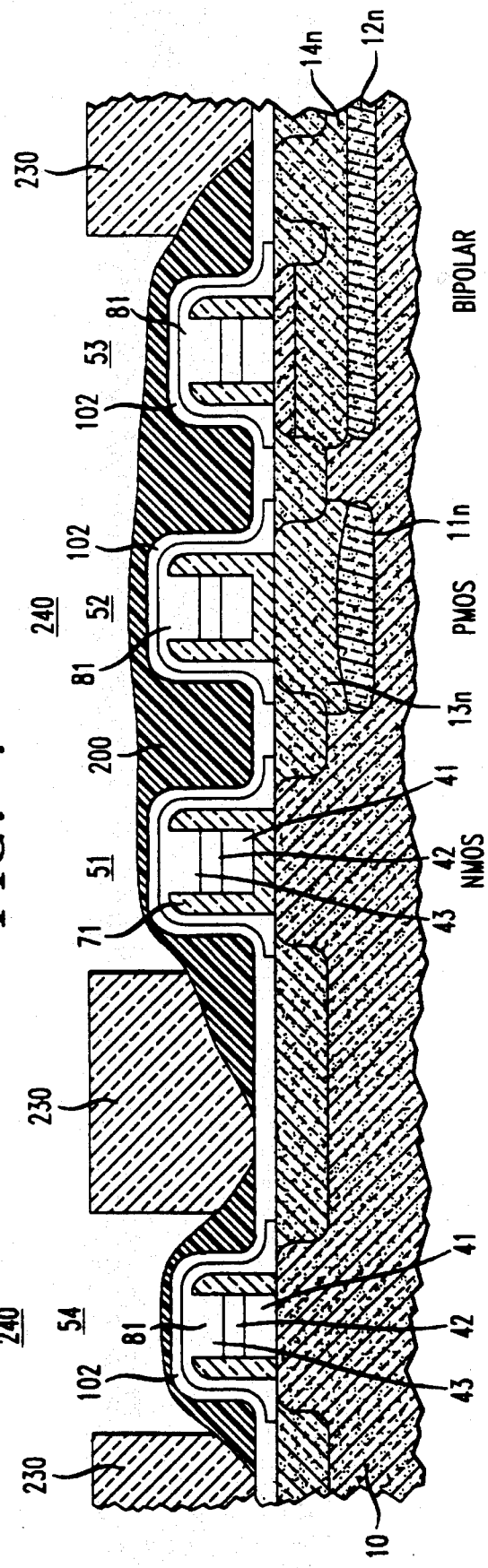
FIG. 7 is a sectional view of a semiconductor wafer in a process for fabricating a BICMOS structure.

After dopant is introduced into the polysilicon, a blanket layer 102 of a material such as silicon nitride is deposited over the surface of the substrate 10. A first resist material 200 is then spin-coated onto the surface of the wafer as depicted in FIG. 7. The resist material has a viscosity of about 20 centipoise to about 2000 centipoise, so that it conforms to the topography on the wafer surface. The topography is illustrated by the stacks 51, 52, 53, and 54 in FIG. 7. It is advantageous if the resist material contains a polymer that is not sensitive to radiation. Typically, the polymer is mixed with an organic solvent so that the resist material has the desired viscosity. An example of a suitable resist material is planarizing coating PC2-600 which is obtained commercially from Futurrex, Inc. It is advantageous if about 20 to about 40 percent by weight of the polymer is combined with about 60 to about 80 percent by weight organic solvent. Example of suitable solvents include n-butanol, 1-methoxy-2-propanol, and combinations thereof. Other organic solvents that are used to reduce the viscosity of resist materials in processes for device fabrication are well known to those skilled in the art and are also contemplated as suitable.

The resist material 200 is spun on the surface of the wafer using conventional techniques. It is advantageous if the spinning speed is about 2000 to about 8000 rpm. As shown in FIG. 7, the viscosity of the resist material 200 is sufficiently low so that, when the resist material 200 is spun on the substrate, it aggregates or collects in the areas around the wafer stacks 51, 52, 53 and 54. After the resist material 200 is spun onto the wafer surface, the resist is hardened by baking the substrate for about 2 to about 10 minutes at a temperature of about 200° C.

An isolation mask is then generated to mask over those portions of the wafer that are not intended to be etched during the subsequent etch-back step. A layer of a conventional energy-sensitive mask material is deposited over the entire surface of the substrate. A latent image of a pattern is then introduced into the conventional mask material. The pattern corresponds to the areas of overlap between the first polysilicon layer 41 and the second polysilicon layer 81 on the substrate. The image is introduced into the mask material using standard lithographic techniques.

Figure 8:
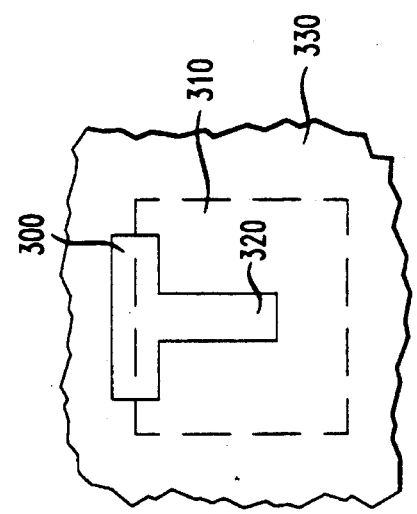
FIG. 8 is a top view of a section of a semiconductor substrate surface in a process for fabricating a BICMOS structure.

FIG. 8, illustrates schematically how the areas of overlap 320 between the first polysilicon layer 300 and the second polysilicon layer 310 are determined. Using conventional computer aided design (CAD) software, the areas of overlap between these two areas are determined. These areas of overlap are then transferred as an image into the mask material by patternwise exposing the mask material to energy. The pattern is then developed, and consequently, the areas that correspond to the overlapping areas of the polysilicon areas are exposed. The mask so formed is designated as 230 in FIG. 7.

It is advantageous if, after the areas of overlap 320 between the first and second layers of polysilicon are determined, these areas are expanded in both the x and y directions before the mask is generated. As illustrated in FIG. 7, the resist material 200 collects around the stacks 51, 52, 53, etc. There is no need to deposit the isolation mask over these thicker portions of the resist material layer 200. Therefore, it is advantageous if the isolation mask 230 does not cover portions of the wafer within a certain proximity, i.e. less than about 1.5 microns, of stacks 51, 52, 53, and 54.

The area not covered by the isolation mask is expanded beyond the area of overlap between the first and second layers of polysilicon because it is much more difficult to generate an isolation mask for areas between stacks that are close together. If x and y are selected to be at least about one-half of the distance between individual stacks in a cluster, (stacks 51, 52, and 53 In FIG. 7) then the isolation mask 230 generated will not cover the cluster of stacks. For example, if x and y are selected as 0.75 microns, an isolation mask is not deposited between stacks that are spaced 1.5 microns or less apart.

The mask material is a standard energy-sensitive material such as Shipley 513, which is commercially obtained from the Shipley Co. Other suitable resist materials are well known to those skilled in the art.

Figure 9:
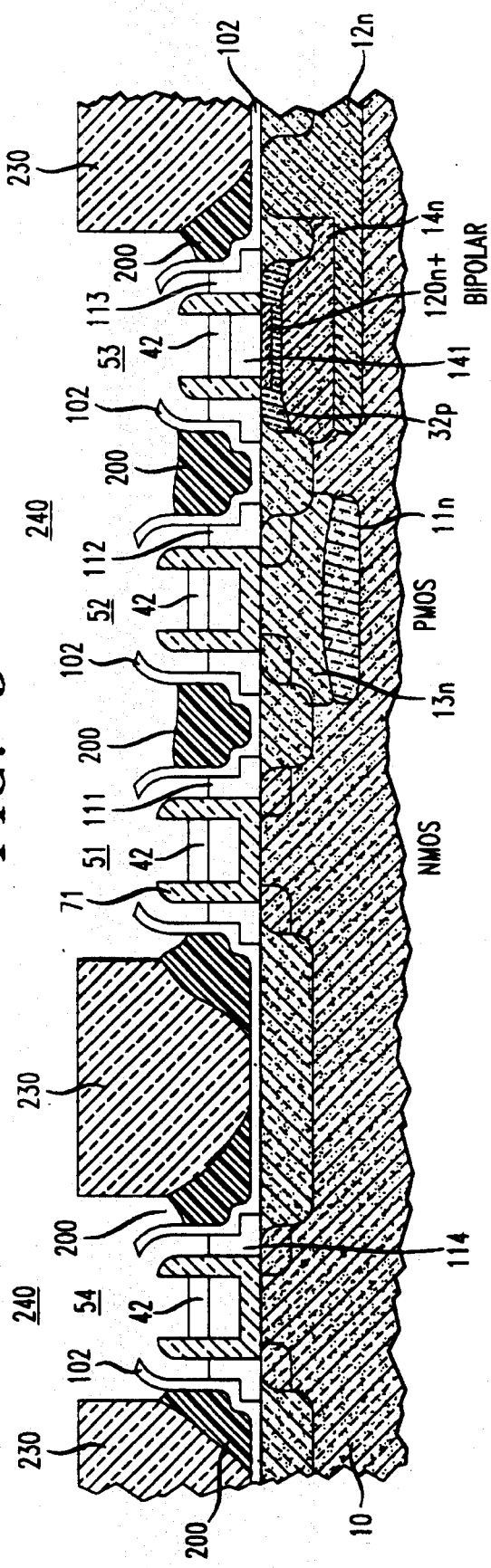
FIGS. 9–12 are sectional views of a semiconductor wafer in various stages of a process for fabricating a BICMOS structure.

Once the isolation mask 230 is in place, the resist material 200 and the silicon nitride layer 102 in the areas not covered by the isolation mask 240 are removed using a standard etchback process. The silicon nitride 102 material is removed using a reactive ion etching process. As illustrated in FIG. 9, only those portions of those layers in regions 240 that do not underly the isolation mask 230 are removed during this step. Also, as illustrated in FIG. 9, the resist material protects the sidewall silicon nitride 102 material from being removed.

The portion of the polysilicon layer 81 (and the dummy polysilicon layer 43 underlying layer 81) in FIG. 7 underlying the silicon nitride removed by the previous etch is then etched back to the etch stop layer 42 made of a material such as silicon nitride or silicon oxide. Conventional etchants and etch conditions are used to etch back the polysilicon layer 81.

The isolation mask 230 is then removed using conventional expedients such as a plasma ash or a solvent. These expedients are known to those skilled in the art. The resist material 200 is removed along with isolation mask 230 as previously described. After this etchback, a structure such as the one illustrate in FIG. 10 is obtained.

Figure 10:
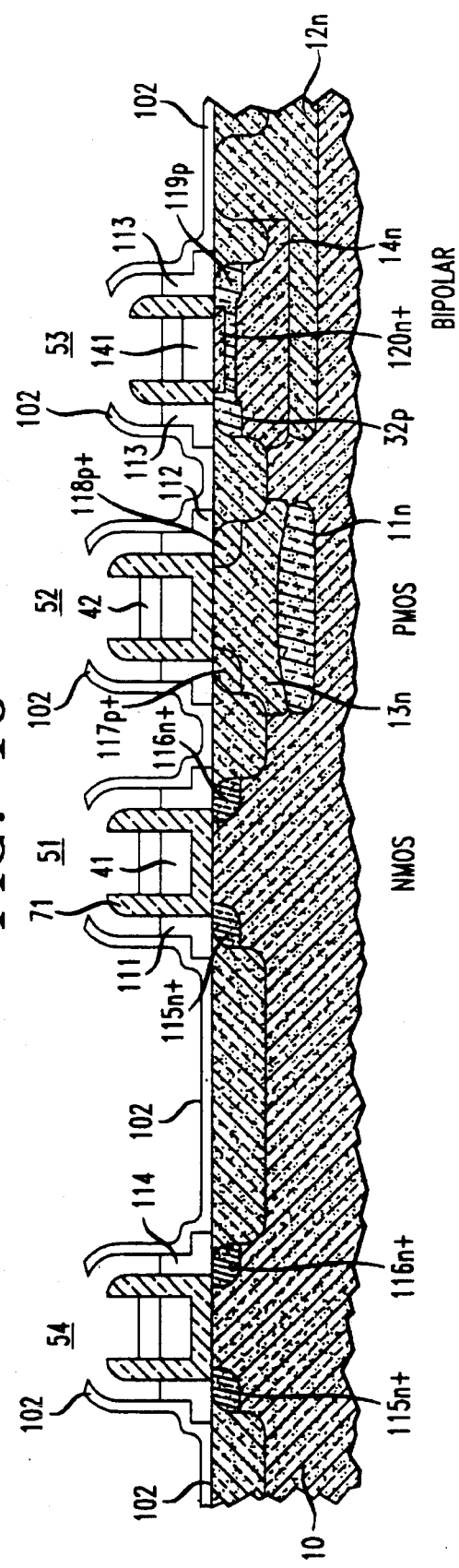

The critical areas of polysilicon material which remain are those shown and designated in FIG. 10 as 111, 112, 113 and 114. As stated previously, it is important that these areas of polysilicon not be removed during the previous processing steps. Those areas of polysilicon material surrounding the silicon dioxide walls for the NMOS device contain an n-type dopant such as phosphorus ions thereby resulting in a reservoir of n-type dopant in this polysilicon material. Those areas of polysilicon material that surround the silicon dioxide walls corresponding to the PMOS and bipolar devices contain a p-type dopant such as boron fluoride dopant, thereby making these areas reservoirs of p-type material. In addition, the polysilicon material designated as area 141 in the cross-section shown in FIG. 10 is a portion of the polysilicon silicon which was deposited as layer 41 and implanted with an n-type dopant such as arsenic so as to create a reservoir of n-type material. At this point in the process the entire wafer is heated to a temperature of about 900° C. for about 30 minutes in order to cause these reservoirs of implanted dopants to diffuse into the silicon substrate 10 thereby creating source and drain regions 115, 116, 117 and 118, the extrinsic base region 119, and a region 120 under stack 53 of the bipolar device, thereby creating an emitter base junction between it and the p-type base region 32.

Figure 11:
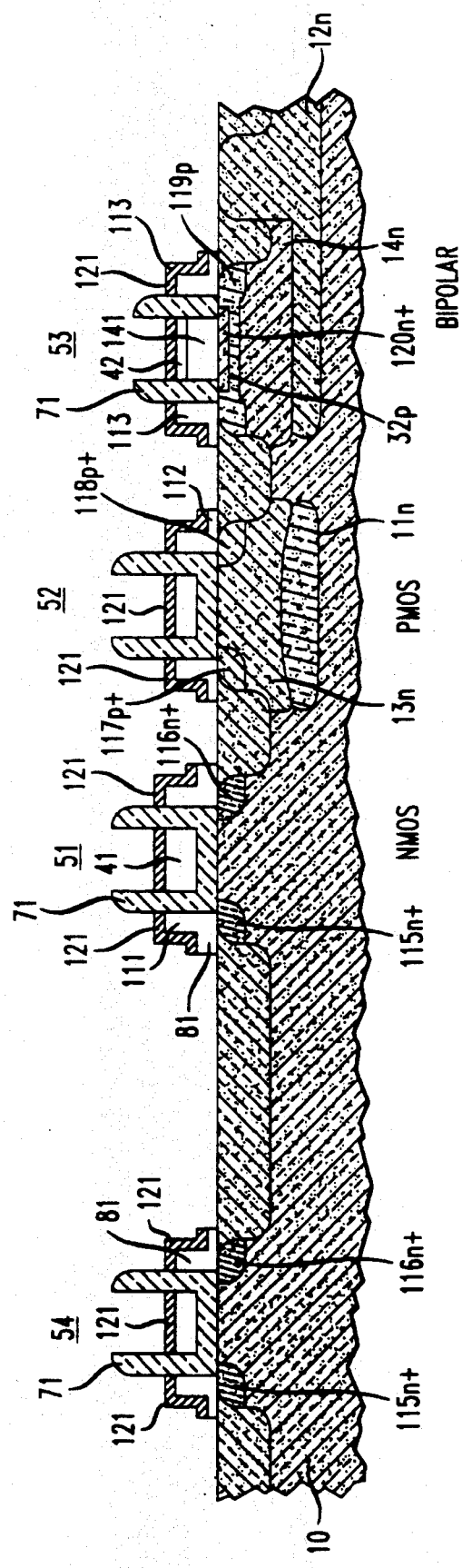

A wet etch of phosphoric acid at 155° C. in a reflux system is then performed to remove the remaining silicon nitride 120 and 42 over the entire wafer. The wafer is then subjected to a selective deposit of tungsten or to a self-aligned silicide reaction thereby depositing a conducting material 121 having a thickness of about 100 nm over all of the exposed areas of polysilicon silicon 41 and 81 as shown in FIG. 11. The protruding oxide wall structures 71 improve the selective process so that no conductive material will form or remain over the areas of silicon dioxide.

Figure 12:
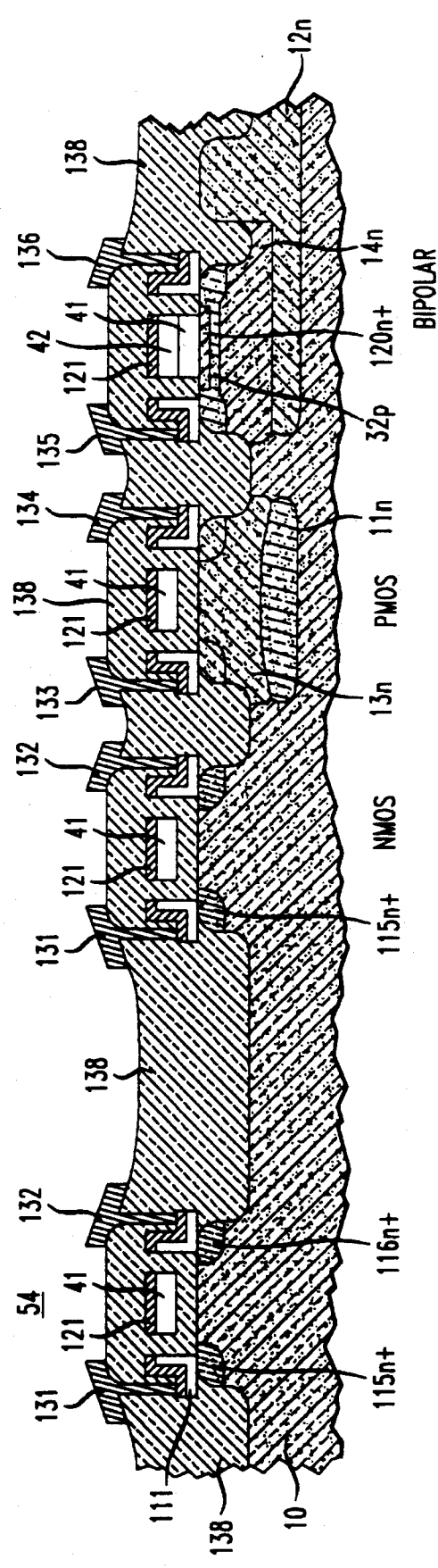

The resistivity of the conductive material is reduced, if desired, by annealing the entire wafer. The high oxide 71 wall protruding above the gate surface is removed (not shown) using a wet oxide etch. After cleaning the entire wafer, a CVD deposition creates a layer of silicon dioxide 138 over the entire wafer as shown in FIG. 12 thereby joining the silicon dioxide walls (71 in FIG. 11) with the field oxides that separate the individual elements 51, 52, 53, and 54 of the device. This silicon dioxide layer 138 has a thickness of about 400 nm. Using a photolithography process and a mask that defines the positions of the holes that are to be created in this silicon dioxide layer to make contact to the previously deposited conductive materials, a combination of a wet etch and reactive ion etch is used to create the holes through the silicon dioxide 138 down to the level of the tungsten or silicide deposit 121., The photoresist material used during the lithography step is then removed. Finally, aluminum is deposited and patterned to form the electrodes shown as 131 in FIG. 12. Contact to the emitter and collector elements of the bipolar device can be made in a similar fashion in a plane not shown in the FIG. 12 cross-section. The wafer is then heated in a final sintering step.

What has been described hereinabove is a specific embodiment of the present invention. Numerous departures may be made by those skilled in the art without departing from the spirit and scope of the present invention. For example, the inventive process is equally applicable to a semiconductor wafer wherein only field effect transistors are created. In this case, the stacks of semiconductor material are positioned only over the gate structures and the steps for the processing of the bipolar devices are unnecessary. The self-aligned polysilicon contact still results in lowering the source and drain capacitance of the field effect transistors that are much closer than the spacing that can be achieved in prior art processes. The process is also applicable to bipolar devices alone and the emitter-base structure created by the process is again lower capacitance and resistance, and therefore capable of operating at higher speeds, than the devices produced in prior art processes.

We claim:

1. A process for creating devices in selected areas of a semiconductor substrate wherein stacks of layers of material comprising a first layer of polycrystalline material are formed over portions of the selected areas and wherein the stacks correspond to elements of the devices, comprising: forming a second layer of polycrystalline material over the substrate and the stacks of material formed over the substrate; removing portions of the polycrystalline material of first layers to electrically isolate the individual devices on the substrate; and forming a barrier layer over the second layer of polycrystalline material thereby forming a structure; forming a coating of a resist material comprising a polymer that is not energy sensitive on the surface of the structure; forming an isolation mask over the structure excepting over those areas where the second layer of polycrystalline material overlaps with the first layer of polycrystalline material in the stacks of polycrystalline material and areas within about 1.5 µm or less from the overlapping areas; etching back the barrier layer overlying the area of overlap between the first layer of polycrystalline material and the second layer of polycrystalline material; and etching back the first layer of polycrystalline material that overlaps the second layer of polycrystalline material.

2. The process of claim 1 wherein the viscosity of the resist material is about 20 centipoise to about 2000 centipoise.

3. The process of claim 1 wherein the coating of resist material is formed by spinning.

4. The process of claim 1 wherein the isolation mask is made of an energy-sensitive resist material.

5. The process of claim 4 wherein the isolation mask is formed by introducing into the energy-sensitive resist material an image of a pattern that corresponds to the areas of overlap between the first layer of polycrystalline material and the second layer of polycrystalline material on the structure and developing the image.

6. The process of claim 5 wherein the pattern that corresponds to the areas of overlap is created by expanding each individual area of overlap on the surface of the structure by about 0.5 µm to about 1.5 µm in both the x and y directions in the plane of the overlapping area.

7. The process of claim 1 further comprising removing the isolation mask of energy-sensitive material from the structure.

* * * * *